United States Patent
Wecker et al.

(10) Patent No.: US 7,755,936 B2
(45) Date of Patent: Jul. 13, 2010

(54) INTEGRATED CIRCUITS, CELL, CELL ARRANGEMENT, METHOD OF READING A CELL, MEMORY MODULE

(75) Inventors: Joachim Wecker, Roettenbach (DE); Manfred Ruehrig, Eckental (DE)

(73) Assignees: Qimonda AG, Munich (DE); ALTIS Semiconductor, SNC, Corbeil Essonnes Cedex (FR)

( * ) Notice: Subject to any disclaimer, the term of this patent is extended or adjusted under 35 U.S.C. 154(b) by 242 days.

(21) Appl. No.: 12/020,902

(22) Filed: Jan. 28, 2008

(65) Prior Publication Data

US 2009/0190390 A1 Jul. 30, 2009

(51) Int. Cl.
*G11C 7/00* (2006.01)
(52) U.S. Cl. .................................. 365/171; 365/173
(58) Field of Classification Search .................. 365/171, 365/173
See application file for complete search history.

(56) References Cited

U.S. PATENT DOCUMENTS

| | | | |
|---|---|---|---|
| 2006/0030058 A1* | 2/2006 | Kent et al. ..................... | 438/3 |
| 2006/0187705 A1* | 8/2006 | Nakamura et al. ............ | 365/171 |
| 2006/0215443 A1* | 9/2006 | Katti ............................ | 365/158 |
| 2006/0274568 A1* | 12/2006 | Fukuzumi et al. ............ | 365/149 |
| 2008/0198648 A1* | 8/2008 | Lee et al. ..................... | 365/171 |
| 2009/0015252 A1* | 1/2009 | Raberg et al. ................ | 324/252 |

OTHER PUBLICATIONS

Jeong, H.S., et al., "Fully Integrated 64Kb MRAM with Novel Reference Cell Scheme," 2002 International Electron Devices Meeting, IEDM '02 Digest, 2002, pp. 551-554, IEEE.
Scheuerlein, R., et al., "A 10ns Read and Write Non-Volatile Memory Array Using a Magnetic Tunnel Junction and FET Switch in each Cell," 2000 International Solid-State Circuits Conference, ISSCC 2000 Digest of Technical Papers, 2000, pp. 128-129, IEEE.

* cited by examiner

*Primary Examiner*—Michael T Tran
(74) *Attorney, Agent, or Firm*—Slater & Matsil, L.L.P.

(57) ABSTRACT

An embodiment of the invention provides an integrated circuit having a cell. The cell includes a first magnetic layer structure having a first magnetization along a first axis, a non-magnetic spacer layer structure disposed above the first magnetic layer structure, and a second magnetic layer structure disposed above the non-magnetic spacer layer structure. The second magnetic layer structure has a second magnetization along a second axis that is arranged in an angle with regard to the first axis such that by changing the direction of the second magnetization, the direction of the first magnetization along the first axis can be determined.

19 Claims, 8 Drawing Sheets

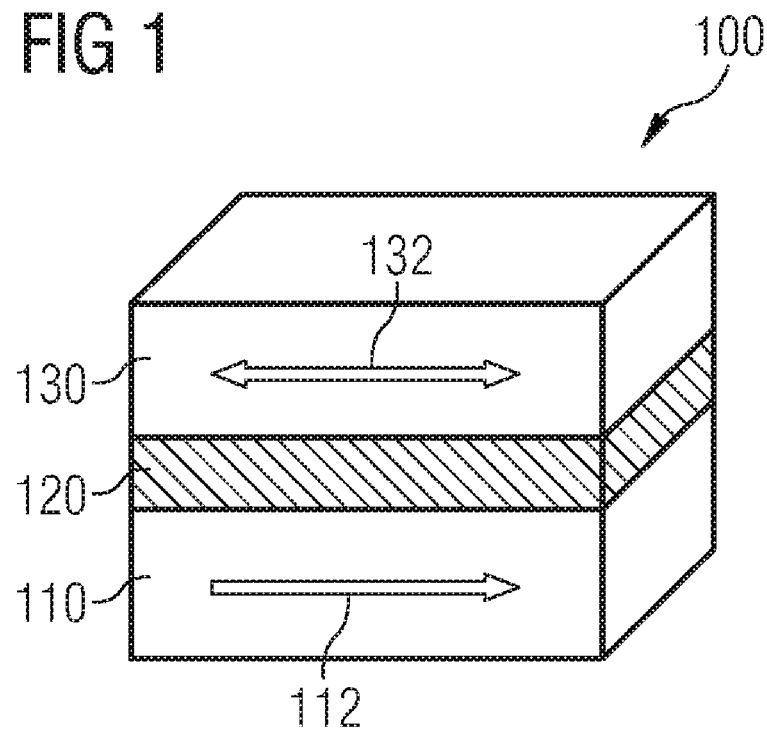
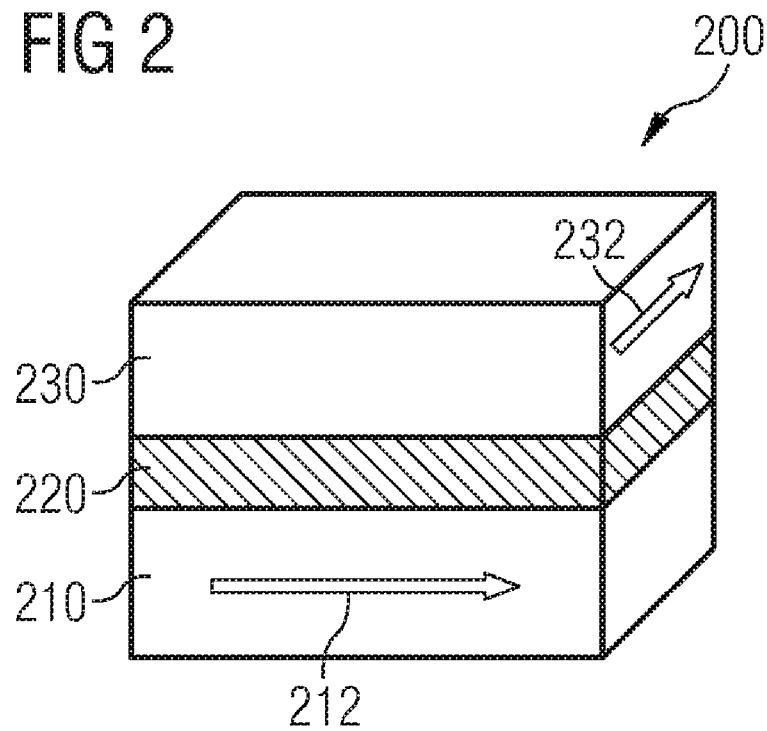

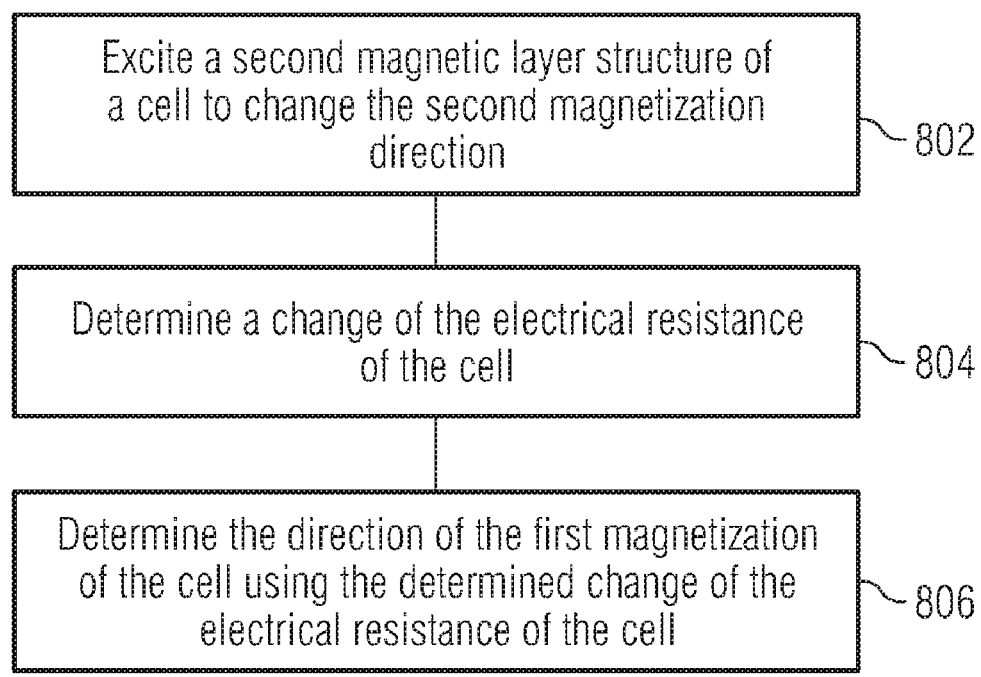

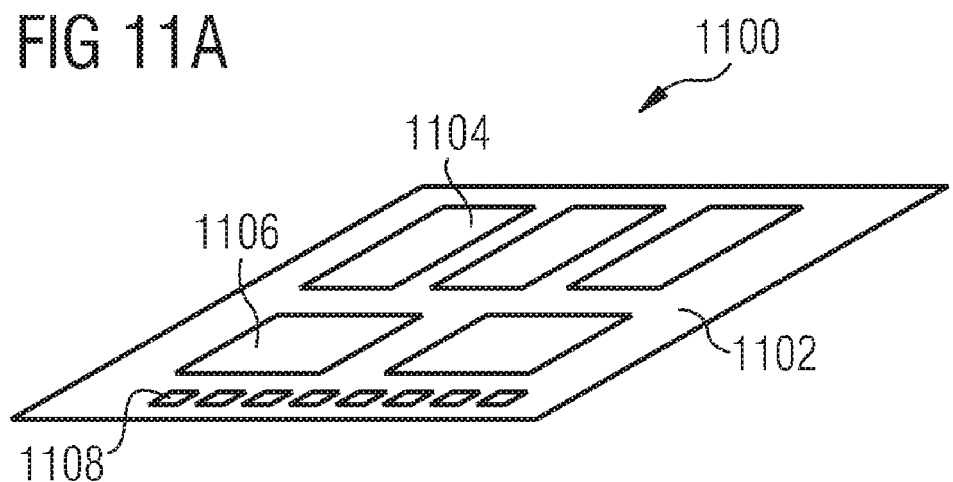
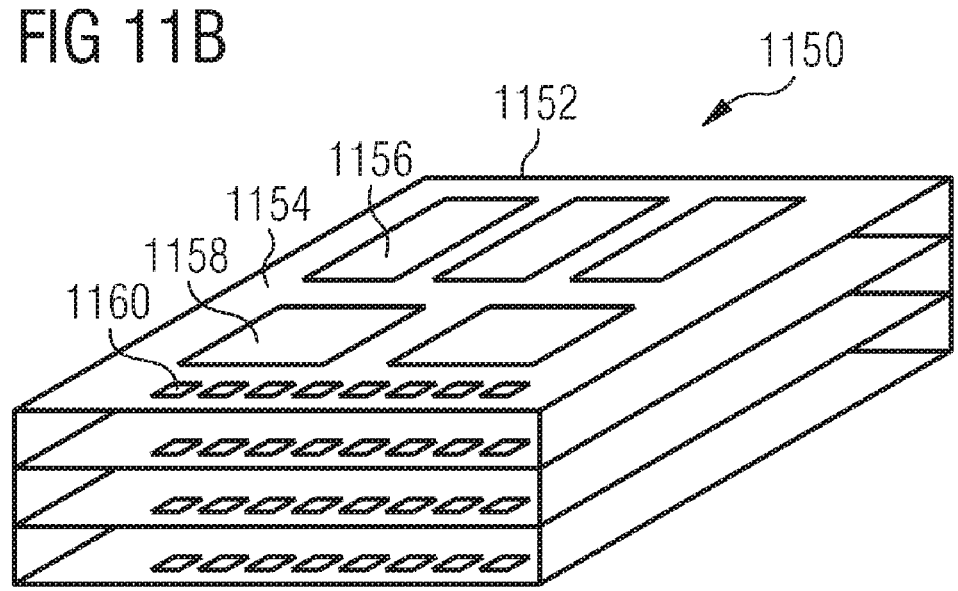

INTEGRATED CIRCUITS, CELL, CELL ARRANGEMENT, METHOD OF READING A CELL, MEMORY MODULE

TECHNICAL FIELD

Embodiments of the present invention relate generally to integrated circuits, a cell, a cell arrangement, a method of reading a cell, and a memory module.

BACKGROUND

Semiconductor devices are used for integrated circuits in a wide variety of electronic applications, such as computers, cellular mobile phones, radios, and televisions.

One particular embodiment of a semiconductor device is a magnetoresistive random access memory (MRAM) which uses spin electronics for storing information therein. Spin electronics combines traditional semiconductor technology and magnetism. Rather than using an electrical charge to indicate the presence of a binary logic "1" or logic "0", the magnetic state of a storage cell is used to represent the binary information. In a common magnetoresistive random access memory, a magnetic storage cell is provided, usually comprising a first magnetic layer (also referred to as a reference layer) and a second magnetic layer (also referred to as a storage layer), the magnetic orientations thereof can be changed. The relative magnetic orientation of the two magnetic layers results in different ohmic resistances of the storage cell. By way of example, in case of a parallel magnetic orientation of the two magnetic layers, a low ohmic resistance results, whereas in case of an anti-parallel magnetic orientation of the first magnetic layer and the second magnetic layer, a higher ohmic resistance results. Thus, by aligning the magnetization of the storage layer parallel or anti-parallel with respect to a reference layer, the change of the ohmic resistance of the cell can be used to store the information in the MRAM cell.

One type of MRAM called thermal select MRAM has the high stability against thermal fluctuations and requires small switching fields for programming. With the reduction of the size of the MRAM cells below about 150 nm, thermal select MRAM cells are robust to thermal fluctuations, since the storage layer is pinned to an anti-ferromagnet, thereby stabilizing it against thermal fluctuations. The cell is programmed by heating it over the blocking temperature by means of a current (the temperature, at which the exchange coupling and therewith the pinning disappears) and by cooling it down in the presence of a counter field (so called thermal writing). This counter field re-magnetizes the storage layer, the new orientation of which is frozen during the cooling down process when becoming lower than the blocking temperature. Thermal select MRAM cells are therefore suitable to be used in high density MRAM devices.

When reading the information stored in a MRAM cell, due to the variations of the cell resistance on a chip caused by the manufacturing thereof, the information of the cell is usually read in such a way that its resistance is compared with the resistance of a reference cell. This would require additional reference cells and additional chip area for the reference cells, thus decreasing the density of MRAM devices.

In another approach, so-called self-reference may be used to read the stored information. As shown in FIG. 1, a typical MRAM cell 100 comprises a reference layer 110, a tunnel barrier layer 120 and a storage layer 130, wherein the information is written into the storage layer 130 by aligning the magnetization 132 of the storage layer 130 to be parallel or anti-parallel to the fixed magnetization 112 of the reference layer 110. Whereas in a self-reference MRAM cell, the information is written into the reference layer 110 or the reference layer system. The original storage layer 130 is used as a read layer or a self-referencing layer. In this case, the states, between which the read layer 130 switches, are always parallel or anti-parallel with respect to the magnetization 112 of the reference layer 110. The reading of the self-reference MRAM cell is carried out by a write operation and read operation which are repeated twice. In this case, the cell is switched twice and the corresponding resistance values are compared with each other to determine the information stored in the self-reference MRAM cell.

The possibility to use self-reference would be helpful for small cells, for example, the thermal select MRAM cells, since they would impose less requirements, e.g., to the TMR (tunneling magnetoresistance signal) signal and the resistance distribution. However, it would need more time and more power consumption due to the plurality of switching and reading.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a magnetoresistive memory cell;

FIG. 2 shows a cell according to an embodiment of the invention;

FIG. 8 shows a flowchart of determining a first magnetization direction of a cell according to one embodiment of the invention;

FIGS. 11A and 11B show a memory module (FIG. 11A) and a stackable memory module (FIG. 11B) in accordance with an embodiment of the invention.

DETAILED DESCRIPTION OF ILLUSTRATIVE EMBODIMENTS

Figure 3A:
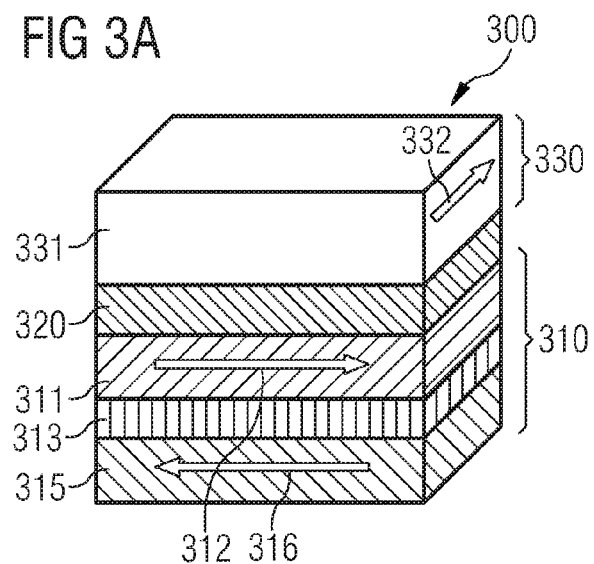
FIGS. 3A and 3B show cells according to other embodiments of the invention.

As used herein the terms "connected" and "coupled" are intended to include both direct and indirect connection and coupling, respectively.

Embodiments of the invention provide self-reference cells with a layer structure such that the reading operation of the cells is shortened compared with conventional self-reference cells.

FIG. 2 shows a cell 200 according to an embodiment of the invention. The cell includes a first magnetic layer structure 210 having a first magnetization 212 along a first axis. A non-magnetic spacer layer structure 220 is disposed above the first magnetic layer structure 210. The cell 200 further includes a second magnetic layer structure 230, wherein the second magnetization 232 of the second magnetic layer structure 230 is along a second axis arranged in an angle with regard to the first axis. By changing the direction of the second magnetization 232, the direction of the first magnetization along the first axis can be determined.

FIG. 3A shows a cell 300 according to one embodiment of the invention. The cell 300 includes a first magnetic layer structure 310, a non-magnetic spacer layer structure 320 and a second magnetic layer structure 330. In an embodiment of the invention, the cell is included in an integrated circuit.

The first magnetic layer structure 310 may include at least one magnetic layer. In one example, the first magnetic layer structure 310 may include a plurality of magnetic layers being magnetically coupled with each other. In another example, the first magnetic layer structure 310 includes a first ferromagnetic layer 315, a coupling layer 313 and a second ferromagnetic layer 311. The second ferromagnetic layer 311 is disposed above the coupling layer 313, which is disposed above the first ferromagnetic layer 315. The coupling layer 313 anti-ferromagnetically couples the first ferromagnetic layer 315 with the second ferromagnetic layer 311, such that the magnetization 316 of the first ferromagnetic layer 315 is anti-parallel to the magnetization 312 of the second ferromagnetic layer 311.

The material of the first ferromagnetic layer 315 or the second ferromagnetic layer 311 may be selected from a group of materials consisting of iron, cobalt or alloys thereof. The material of the first ferromagnetic layer 315 or the second ferromagnetic layer 311 may also be selected from other ferromagnetic materials which are not listed herein.

In one embodiment, the coupling layer 313 is made of a metal. Examples of metals which the coupling layer 313 includes or is made of include but are not limited to ruthenium, chromium, gold, rhenium, osmium, silver or copper.

The second magnetic layer structure 330 has a magnetization 332 which is arranged in an angle with regard to the magnetization 312 of the first magnetic layer structure 310. The second magnetic layer structure 330 may include at least one magnetic layer 331. In another example, the second magnetic layer structure 330 may include a plurality of magnetic layers being magnetically coupled with each other, which are not shown in FIG. 3A.

Figure 3B:
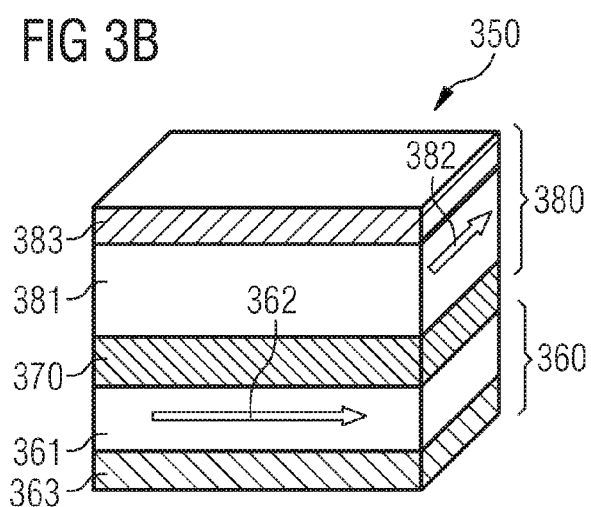

FIG. 3B shows a cell 350 according to another embodiment of the invention, which includes a first magnetic layer structure 360, a non-magnetic spacer layer structure 370 and a second magnetic layer structure 380.

The first magnetic layer structure 360 may include one or more magnetic layer 361 being magnetically coupled with each other, wherein only one magnetic layer 361 is shown in FIG. 3B. In another example, the first magnetic layer structure 360 may include a first ferromagnetic layer, a coupling layer and a second ferromagnetic layer as in FIG. 3A.

According to an embodiment, the first magnetic layer structure 360 further includes a first magnetic pining structure 363 having a first blocking temperature. The first magnetic pinning structure 363 may include anti-ferromagnetic material which pins the magnetization 362 of the magnetic layers of the first magnetic layer structure 360. The first magnetic pinning structure 363 may include or be made of iridium manganese in one example.

The second magnetic layer structure 380 has a magnetization 382 which is arranged in an angle with regard to the magnetization 362 of the first magnetic layer structure 360. The second magnetic layer structure 380 may include one or more magnetic layer 381 being magnetically coupled with each other, wherein only one magnetic layer 381 is shown in FIG. 3B.

In an embodiment, the second magnetic layer structure 380 further comprises a second magnetic pining structure 383 having a second blocking temperature. The second magnetic pinning structure 383 may include anti-ferromagnetic material which pins the magnetization of the magnetic layers of the second magnetic layer structure 380. In one example, the second magnetic pinning structure 383 may include or be made of platinum manganese.

According to the embodiment of the invention, the second blocking temperature is higher than the first blocking temperature. In this case, the second magnetic layer structure 380 will not be affected during the writing, e.g., the thermal writing, of the first magnetic layer structure 360. For example, the second magnetic pinning structure 383 including platinum manganese has a blocking temperature of about 350° C., and the first magnetic pinning structure 363 comprising iridium manganese has a blocking temperature of about 200 to 250° C. The magnetization 382 of the second magnetic layer structure 380 may be set by means of a heat treatment being carried out only once and in a homogeneous manner over the entire wafer comprising the cell (e.g., 280° C., 100 min) in a magnetic field (e.g., 10 kA/m). The writing operation to pin the magnetization of the first magnetic layer structure 360 is then carried out by heating the cell up to a temperature between the first and the second blocking temperature, and applying a field with a particular direction depending on the information to be written. Since the second magnetic pinning structure 383 has a higher blocking temperature, the writing of the first magnetic layer structure will not affect the magnetization of the second magnetic layer structure 380.

In other embodiments, the material of the first and the second magnetic pinning structure 363, 383 may be selected to be other suitable anti-ferromagnetic material such that the blocking temperature of the second magnetic pinning structure 383 is higher than that of the first magnetic pinning structure 363.

Figure 4:
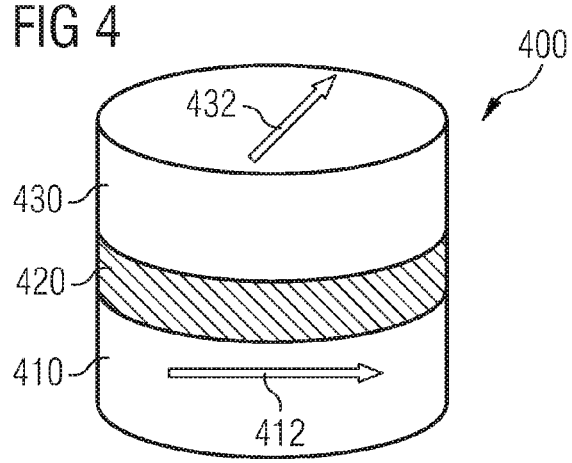
FIG. 4 shows a cell according to another embodiment of the invention.

A cell 400 according to another embodiment of the invention is shown in FIG. 4.

In an embodiment of the invention, the cell 400 includes a first magnetic layer structure 410 having a first magnetization 412, a non-magnetic spacer layer structure 420, and a second magnetic layer structure 430 having a second magnetization 432 arranged in an angle with regard to the first magnetization 412.

In an embodiment, the first magnetic layer structure 410 may comprise a first magnetic pinning structure, and the second magnetic layer structure 430 may comprise a second magnetic pinning structure, similar to the FIG. 3A.

In one embodiment, the cell 400 is in an elliptical shape, such that a shape anisotropy with an angle, e.g., 90° C., with regard to the desired axis of the first magnetic layer structure 410 is introduced. The axis of the first magnetic layer structure 410 would then be in the direction of the short axis of the ellipse, and the second magnetic layer structure 430 would be magnetized along the long axis of the ellipse. The first magnetic layer structure 410 would be pinned by direct exchange coupling to a natural anti-ferromagnet. The magnetization of the second magnetic layer structure 430 is then arranged in an angle with regard to the magnetization of the first magnetic layer structure 410. It is to be noted that the cells 300 and 350 in FIGS. 3A and 3B may also be in elliptical shape with a shape anisotropy in other embodiments of the invention.

In another embodiment of the invention, the cell 400 may be in a circular shape so that no competing shape anisotropy influences the magnetization of the cell 400. The magnetization of the first and the second magnetic layer structure 410, 430 may be pinned using the pinning structure similar to FIG. 3A in one example. In another example, the magnetization of the first and the second magnetic layer structure 410, 430 may be set to be in an angle with regard to each other using a material with an intrinsic anisotropy.

In the embodiments as shown in FIGS. 2, 3A, 3B and 4 above, the one or more magnetic layer of the first magnetic layer structures 210, 310, 360, 410 may include or be made of a material selected from a group of materials consisting of iron, cobalt or alloys thereof. The material of the first magnetic layer structures 210, 310, 360, 410 may also be selected from other ferromagnetic materials which are not listed herein. The first magnetic layer structures 210, 310, 360, 410 may be an information storage layer structure used to store one or more data items, for example, logic "0" or "1".

The one or more magnetic layer of the second magnetic layer structures 230, 330, 380, 430 may comprise or be made of a material selected from a group of materials consisting of iron, cobalt or alloys thereof. The material of the second magnetic layer structures 230, 330, 380, 430 may be selected from other ferromagnetic materials which are not listed herein in other embodiments. In accordance with the embodiment of the invention, the second magnetic layer structures 230, 330, 380, 430 may be a self-referencing layer (also referred to as read layer) used to read the content stored in the first magnetic layer structures 210, 310, 360, 410, in a read operation.

In another embodiment, the one or more magnetic layer of the second magnetic layer structures 230, 330, 380, 430 may be made of a material having an intrinsic anisotropy, which is impinged during the sputtering by means of a magnetic field or which is impinged by a thermal treatment in a magnetic field. The material should be selected such that during the thermal writing of the information in the first magnetic layer structures 210, 310, 360, 410, the magnetization of the second layer structures 230, 330, 380, 430 will not be influenced. Examples of the suitable materials include amorphous alloys having a high glass and Curie temperature (e.g., $Fe_{76}(Si,B)_{24}$), or crystalline alloys (e.g., CoFe or NiFeCo). In an embodiment wherein the cells are in circular shape without competing shape anisotropy influences, the magnetization of the second layer structures 230, 330, 380, 430 may be stabilized by means of an intrinsic anisotropy in the direction of the exchange bias.

The above embodiments for the first magnetic layer structures 210, 310, 360, 410 and the second layer structures 230, 330, 380, 430 may be implemented alone or in combination such that the magnetization of the second layer structures 230, 330, 380, 430 is arranged in an angle with regard to the magnetization of the first magnetic layer structures 210, 310, 360, 410. In one embodiment, such an angle may be in a range from about 45° to about 135°. In another embodiment, the angle may be in a range from about 60° to about 130°. In a further embodiment, the angle is about 90°.

The non-magnetic spacer layer structure 220, 320, 370, 420 may comprise or be made of a material selected from a group of materials consisting of aluminum oxide, magnesium oxide, titanium oxide or tantalum oxide.

According to one embodiment, the cells 200, 300, 350, 400 are memory cells. The memory cell may be a magnetoresistive memory cell in one example. In another example, the memory cell may be a thermal select magnetoresistive memory cell. The non-magnetic spacer layer structure is also referred to as the tunnel barrier layer in the example that the cells are magnetoresistive memory cells.

Figure 5A:
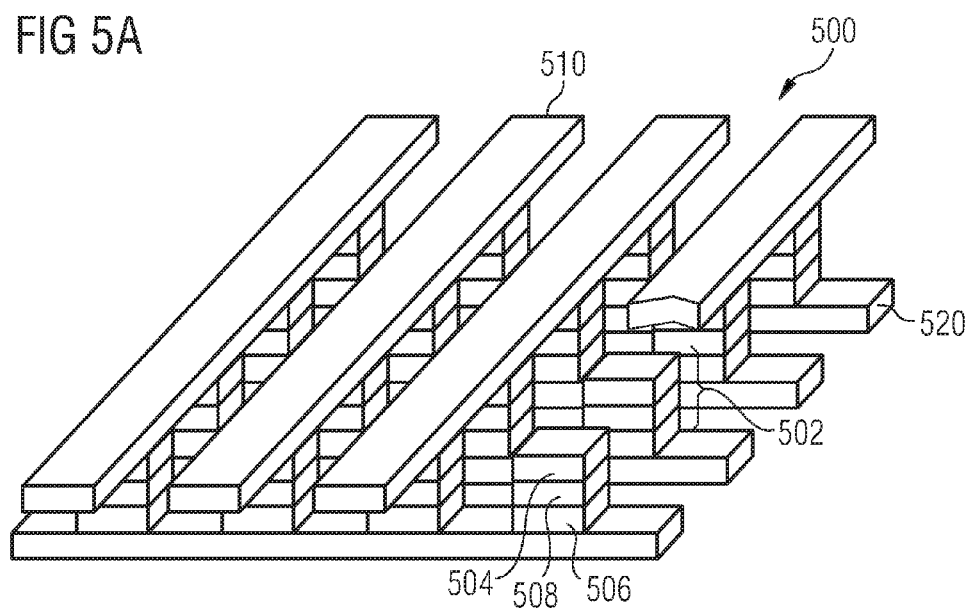
FIGS. 5A and 5B show integrated circuits having a cell arrangement according to the embodiments of the invention.

According to one embodiment of the invention, an integrated circuit having a cell arrangement 500 is illustrated in FIG. 5A. The cell arrangement 500 includes a plurality of cells 502 arranged in matrix configuration. The cells 502 may be arranged in a different way than in a matrix form, for example, in a zig-zag architecture in another example. Each cell 502 includes a read layer 504, a storage layer 506 and a tunnel barrier layer 508 sandwiched inbetween. The cells 502 may be any of the cells 200, 300, 350, 400 as explained above in the embodiments of the invention. Accordingly, the read layer 504 and the storage layer 506 may each comprise multiple layers where appropriate.

In one embodiment, the cells 502 are magnetoresistive memory cells. Two groups of conductive lines are arranged in rows and columns such that the magnetoresistive memory cells 502 lie at the intersection of the two groups of conductive lines. In one example, the first group of conductive lines are bit lines 510 arranged next to the read layer 504 of the magnetoresistive memory cells 502, and the second group of conductive lines are word lines 520 arranged next to the storage layer 506 of the magnetoresistive memory cells 502. The bit lines 510 are arranged perpendicular to the word lines 520. It is noted that the order of the bit lines 510 and the word lines 520 may be reversed, such that the bit lines 510 are arranged next to the storage layer 506 and the word lines 520 are arranged next to the read layer 504 of the magnetoresistive memory cells 502. Current may be provided to flow through the respective bit lines 510 and/or word lines 520, in order to read the information stored in the selected cells 502 or to produce magnetic field to write information into the selected cells 502.

Figure 5B:
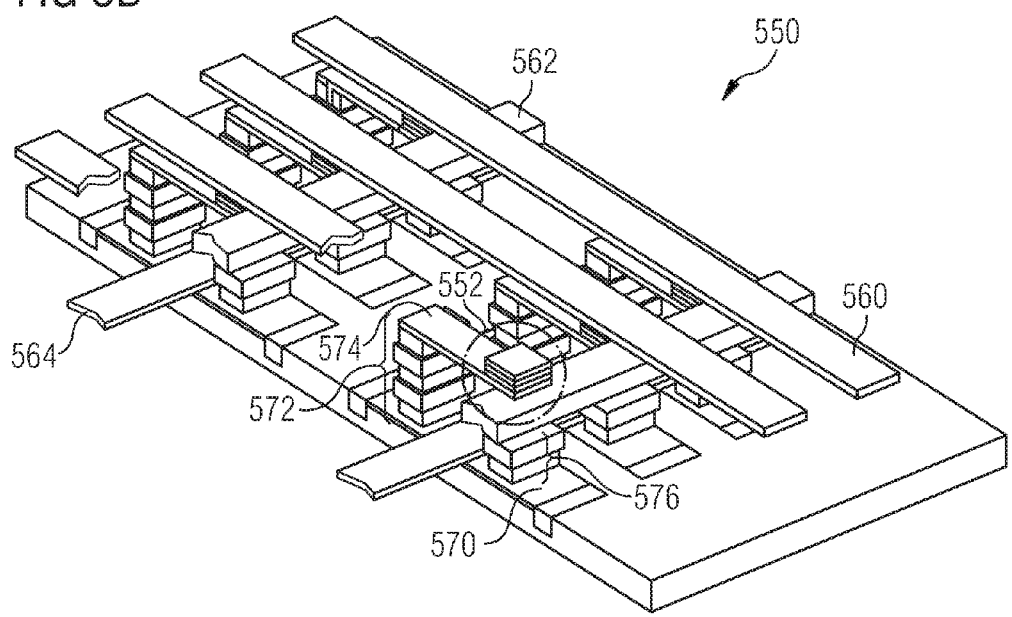

An integrated circuit having a cell arrangement 550 according to another embodiment of the invention is shown in FIG. 5B. In the cell arrangement 550, each cell is connected with a transistor, as will be explained below. The cells 552 may include a read layer, a storage layer and a non-magnetic layer according to any of the cells 200, 300, 350, 400 as explained in the embodiments above. The bit lines 560 and the word lines 562 are arranged in a matrix structure having rows and columns, with the cells 552 being arranged at the intersection of the respective pair of lines. A third group of conductive lines, i.e., the control lines 564 are arranged such that they are parallel to the word lines 562 and perpendicular to the bit lines 560. The control lines 564 are connected to the gate of the respective transistor 570, while the drain of the respective transistor 570 is connected to the cell 552 through a conductive structure 572 and an interconnect layer 574. The conductive structure 572 may be a single conductive layer, or may include various vias, interconnects and additional conductive structures. The source of the transistor 570 may be grounded, e.g., via a ground contact 576. Thus, the control lines 564 control, for example, the selection of the respective cell 552 through the respective transistor 570 to perform reading or writing operations. The architecture of this cell arrangement is also referred to as 1T1MTJ (one transistor, one MTJ) architecture, if the cells 552 are magnetoresistive memory cells for example.

It is to be noted that various types of transistors may be used depending on the design of the circuit, wherein the connected component of the source, drain and gate of the transistors will be changed correspondingly.

In one example, the cells 552 are thermal select magnetoresistive memory cells. The control line 564 may be driven high to switch on the transistor 570, and the current is provided by the bit line 560 to heat the cells 552. The current flowing through the word line 562 provides a magnetic field which would change the magnetization of the read layer of the cells 552 to a corresponding direction, thereby determining the magnetization direction of the storage layer of the cells 552.

In the embodiment wherein the cells 502, 552 are thermal select magnetoresistive memory cells, the cell arrangement 500, 550 may also comprise a heater heating at least one cell 502, 552 in the cell arrangement 500, 550.

Figure 6:
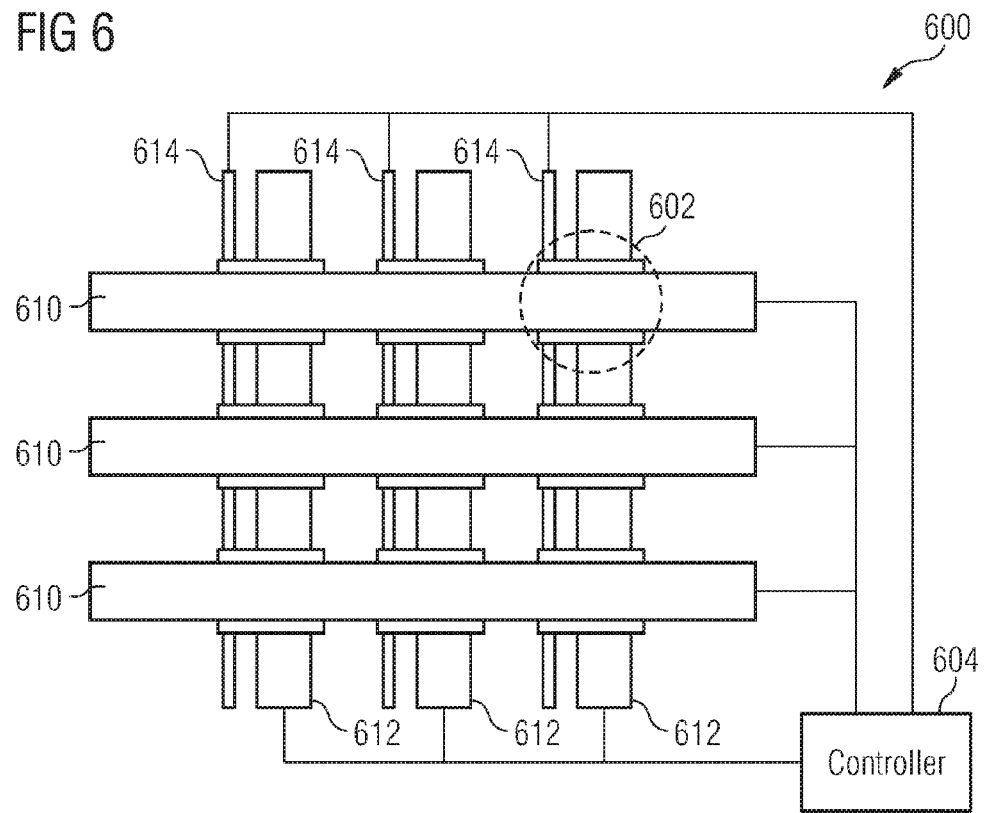
FIG. 6 shows an integrated circuit having a cell arrangement according to an embodiment of the invention.

FIG. 6 shows a top view of an integrated circuit having a cell arrangement 600 according to one embodiment of the invention. The cell arrangement 600 includes a plurality of cells 602 and a controller 604 controlling the reading and writing of the plurality of cells 602. The cells 602 may be any of the cells 200, 300, 350, 400 explained in the above embodiments. As shown in FIG. 6, the controller 604 is connected with every bit line 610, word line 612 and control line 614, such that the current through each of these lines is controlled by the controller 604. When controlling the reading of a selected cell 602 according to an embodiment, the controller 604 excites the second magnetic layer structure of the selected cell 602, in one embodiment by providing a magnetic field through the bit line 610 and word line 612, and in another embodiment by providing a heating current through the bit line 610 and providing a magnetic field through the word line 612. By controlling the duration, strength and direction of the heating current or magnetic field generating current, the magnetization of the second magnetic layer structure is changed. The controller 604 then determines a change of the electrical resistance of the selected cell 602. Depending on the determined change of the electrical resistance of the cell 602, the direction of the magnetization of the first magnetic magnetic layer structure of the cell 602 can be determined by the controller 604, thereby determining the information stored in the cell 602.

The controller 604 may be a microcontroller, a microprocessor (including, e.g., a complex instruction set computer (CISC) processor or a reduced instruction set computer (RISC) processor), or hard wired logic. It may include a plurality of sub-controllers, for example, a bit line sub-controller, a word line sub-controller and a control line sub-controller such that each sub-controller controls the different groups of conductive lines, respectively.

It is to be understood that the cell arrangement 600 can also include only bit lines 610 and word lines 612 without control lines 614, similar to the structure of FIG. 5A. In such a case, the controller 604 is connected with every bit line 610 and word line 612 so as to control the current through each of these lines.

Figure 7:
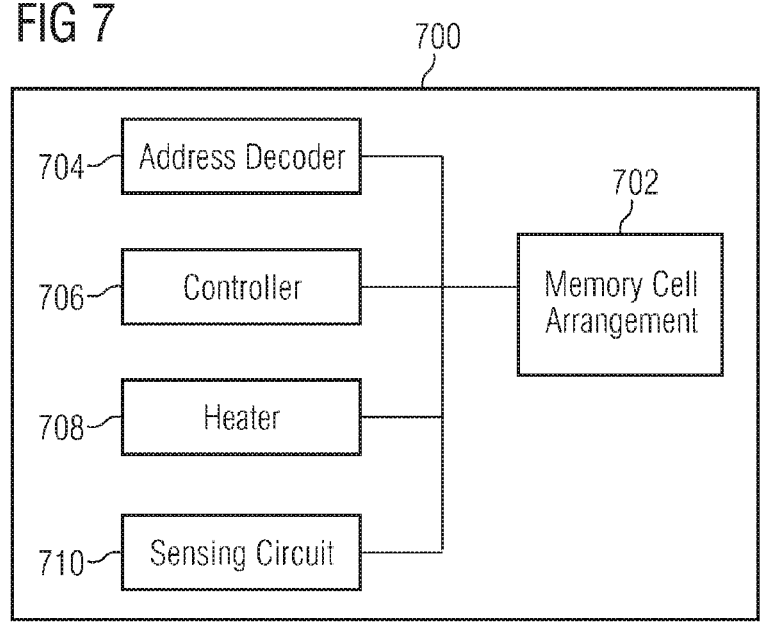
FIG. 7 shows an integrated circuit in accordance with an embodiment of the invention.

FIG. 7 illustrates an integrated circuit 700 in accordance with an exemplary embodiment of the invention.

The integrated circuit 700 includes, inter alia, a memory cell arrangement 702 having a plurality of memory cells, wherein the memory cell arrangement 702 may be any of the cell arrangement 500, 550, 600 explained in the embodiments above.

Furthermore, the integrated circuit 700 includes an address decoder 704, which receives a logical address of a memory cell to be selected, for example, a memory cell to be programmed, read or erased, and maps the logical address of the memory cell to the actual physical address of the memory cell to be selected within the memory cell arrangement 702. Furthermore, the address decoder 704 provides the select signal to the control lines, to which the memory cell to be selected is connected to such that the desired memory cell within the memory cell arrangement 702 is selected.

Furthermore, a controller 706, for example a microprocessor, in an alternative embodiment of the invention implemented as hard wired logic, is provided. The controller 706 provides voltage signals in order to provide the required voltages and currents in order to perform the respectively selected operation on the selected memory cell within the memory cell arrangement 702. By way of example, the controller 706 provides a sequence of voltages and currents to a selected memory cell in order, for example, to align or change the magnetization of the selected memory cells.

In one embodiment, the integrated circuit 700 may further includes a heater 708, which is controlled by the controller 706 in order to heat the selected memory cell.

A sensing circuit 710 is provided, which is, in one embodiment of the invention, formed by one or a plurality of sense amplifiers (for example, one or more current amplifier(s) or one or more voltage amplifier(s)) which are used to sense the current flowing through a selected memory cell within the memory cell arrangement 702 and compare it with the current flowing to a selected reference cell, thereby providing a difference current, which may be used for determining the programming state of the memory cell which is selected.

FIG. 8 shows a flowchart illustrating determination of a first magnetization direction of a cell of an integrated circuit according to one embodiment of the invention. At 802, a second magnetic layer structure of the cell is excited such that the second magnetization direction is changed. The second magnetization of the second magnetic layer structure is along a second axis arranged in an angle with regard to a first axis along which the first magnetization of the cell is oriented. At 804, a change of the electrical resistance of the cell is determined. Using the determined change of the electrical resistance of the cell, the direction of the first magnetization along the first axis is determined at 806.

Figure 9A:
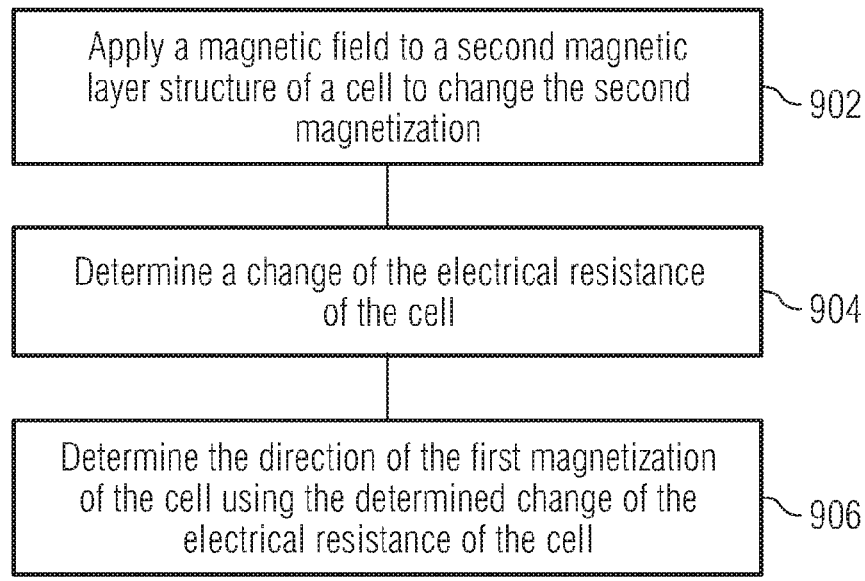
FIGS. 9A and 9B show flowcharts of determining a first magnetization direction of a cell according to other embodiments of the invention.

A flowchart illustrating the determination of a first magnetization direction of a cell of an integrated circuit according to another embodiment of the invention is shown in FIG. 9A. At 902, a magnetic field is applied to a second magnetic layer structure of the cell such that the second magnetization direction is changed. The applied magnetic field may be magnetic field pulse in another embodiment. The second magnetization of the second magnetic layer structure is along a second axis arranged at an angle with regard to a first axis along which the first magnetization of the cell is oriented. At 904, a change of the electrical resistance of the cell is determined. Depending on the determined change of the electrical resistance of the cell, the direction of the first magnetization along the first axis is determined at 906.

Figure 9B:
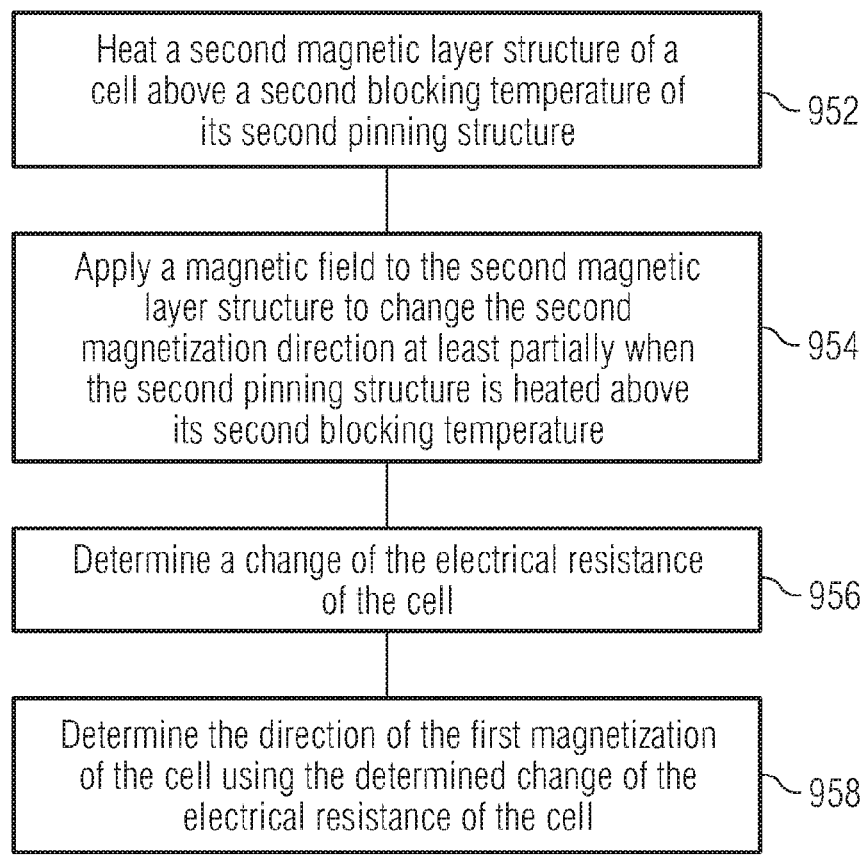

FIG. 9B shows a flowchart of determining the direction of a first magnetization of a cell of an integrated circuit according to a further embodiment of the invention. At 952, a second magnetic layer structure of the cell is heated above a second blocking temperature of its second pinning structure. The cell may include a first magnetic layer structure having, for example, a first pinning structure, which has a first blocking temperature lower than the second blocking temperature. The heating may be performed by a heater in one embodiment, and may be performed by applying a heating current to the second magnetic layer structure in another embodiment.

At 954, a magnetic field is applied to the second magnetic layer structure such that the second magnetization direction is changed at least partially when the second pinning structure is heated above its second blocking temperature. In another example, a magnetic field pulse may be applied to change the second magnetization direction. The second magnetization of the second magnetic layer structure is along a second axis arranged in an angle with regard to a first axis along which the first magnetization of the cell is oriented. The magnetic field or the magnetic field pulse is controlled such that the first magnetization of the cell will not be affected.

At 956, a change of the electrical resistance of the cell is determined. Depending on the determined change of the electrical resistance of the cell, the direction of the first magnetization along the first axis is determined at 958.

In the above embodiments of the invention, the determined direction of the first magnetization of the cell represents the information stored in the cell, as illustrated in FIG. 10.

Figure 10A:
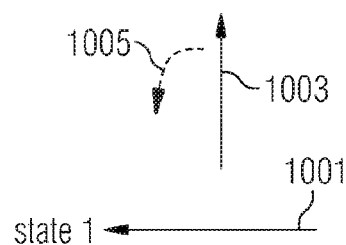
FIGS. 10A-10D, collectively as FIG. 10, illustrates the change of resistance of a cell according to an embodiment of the invention.
Figure 10B:
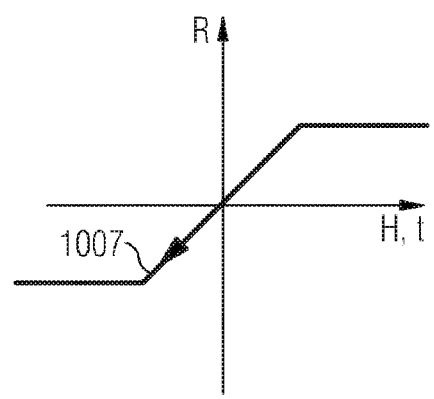

In FIG. 10(a), the first magnetization of the cell is along a first axis 1001. The second magnetization of the cell is along a second axis 1003, wherein the second axis is arranged in an angle with regard to the first axis 1001, e.g., 90°. By applying a magnetic field with a particular direction, e.g., perpendicular to the magnetization direction of a second magnetic layer structure of the cell, the second magnetization is changed along the direction of 1005. In another example, the applying of the magnetic field may be applied at least partially when the second magnetic layer structure is heated above a blocking temperature of its second pinning structure. As the resistance of the cell is minimal when the second magnetization is parallel to the first magnetization, the resistance of the cell will be decreasing when the second magnetization of the second magnetization changes along the direction of 1005, which is reflected by the decreasing line 1007 in FIG. 10(b). Accordingly, by determining the change of the electrical resistance of the cell to be negative, the first magnetization can be determined to be along the direction of 1001, which may represent state 1 of the cell, for example, logic "0".

Figure 10C:
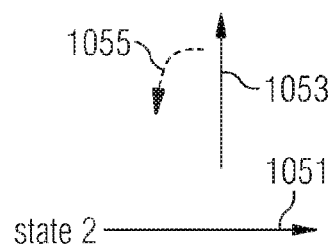
Figure 10D:
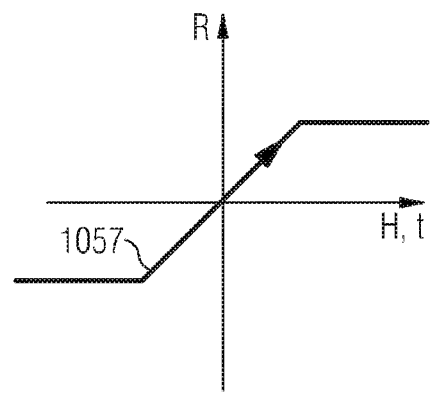

In FIG. 10(c), the first magnetization of the cell is along a first axis 1051, which may represent state 2 of the cell. The second magnetization of the cell is along a second axis 1053, wherein the second axis 1053 may be arranged perpendicular to the first axis 1051. By applying a magnetic field with a particular direction to a second magnetic layer structure of the cell, the second magnetization is changed along the direction of 1055. In another embodiment, the applying of the magnetic field may be applied at least partially when the second magnetic layer structure is heated above a blocking temperature of its second pinning structure. As the resistance of the cell is maximal when the second magnetization is anti-parallel to the first magnetization, the resistance of the cell will be increasing when the second magnetization of the second magnetization changes along the direction of 1055, which is reflected by the increasing line 1057 in FIG. 10(d). Accordingly, by determining the change of the electrical resistance of the cell to be positive, the first magnetization can be determined to be along the direction of 1051, which represents state 2 of the cell, e.g., logic "1".

In the above embodiments of FIG. 10, since the second magnetization is aligned at an angle with regard to the first magnetization of the cell, the second magnetization may be changed under a magnetic field with a particular direction. Dependent on how the cell is programmed, a field or a field pulse oriented perpendicular to the magnetization direction of the second magnetic layer structure excites the second magnetization either in the direction of the first magnetization or anti-parallel thereto. The resistance thus either decreases or increases. The stored information can be read out in a differential manner using the sign of the change of the resistance. The magnitude of the field which changes the second magnetization is dependent on the required signal. For example, if the field corresponds to the anisotropy field, then the read layer has been rotated (excited) by 90° and the change of the resistance is saturated at ½ of the maximal possible change.

In accordance with the embodiments of the invention, write operation and read operation on the cells may be carried out in a synchronous manner, as a magnetic field is provided in a direction perpendicular to the magnetization of the second magnetic layer structure, i.e., the read layer of the self-referencing cell.

The embodiment of the invention using self-reference layers minimizes the size of the cell arrangement in an integrated circuit since separate reference cells are not needed. The reading operation of the cells is shortened and the read access is minimized by dynamically reading.

As shown in FIGS. 11A and 11B, in some embodiments, memory devices such as those described herein may be used in modules. In FIG. 11A, a memory module 1100 is shown, on which one or more memory devices 1104 are arranged on a substrate 1102. The memory device 1104 may include numerous memory cells, each of which uses a memory element in accordance with an embodiment of the invention. The memory module 1100 may also include one or more electronic devices 1106, which may include memory, processing circuitry, control circuitry, addressing circuitry, bus interconnection circuitry, or other circuitry or electronic devices that may be combined on a module with a memory device, such as the memory device 1104. Additionally, the memory module 1100 includes multiple electrical connections 1108, which may be used to connect the memory module 1100 to other electronic components, including other modules.

As shown in FIG. 11B, in some embodiments, these modules may be stackable, to form a stack 1150. For example, a stackable memory module 1152 may contain one or more memory devices 1156, arranged on a stackable substrate 1154. The memory device 1156 contains memory cells that employ memory elements in accordance with an embodiment of the invention. The stackable memory module 1152 may also include one or more electronic devices 1158, which may include memory, processing circuitry, control circuitry, addressing circuitry, bus interconnection circuitry, or other circuitry or electronic devices that may be combined on a module with a memory device, such as the memory device 1156. Electrical connections 1160 are used to connect the stackable memory module 1152 with other modules in the stack 1150, or with other electronic devices. Other modules in the stack 1150 may include additional stackable memory modules, similar to the stackable memory module 1152 described above, or other types of stackable modules, such as stackable processing modules, control modules, communication modules, or other modules containing electronic components.

In an embodiment of the invention, an integrated circuit having a cell is provided. The cell may include a first magnetic layer structure having a first magnetization along a first axis, a non-magnetic spacer layer structure disposed above the first magnetic layer structure, and a second magnetic layer structure disposed above the non-magnetic spacer layer structure, wherein the second magnetic layer structure has a second magnetization along a second axis that is arranged at an angle with regard to the first axis such that by changing the direction of the second magnetization, the direction of the first magnetization along the first axis can be determined.

The first magnetic layer structure may include at least one magnetic layer.

Furthermore, the first magnetic layer structure may include a plurality of magnetic layers being magnetically coupled with each other.

In an embodiment of the invention, the material of the magnetic layer or the plurality of magnetic layers of the first magnetic layer structure may be selected from a group of materials consisting of iron, cobalt or alloys thereof.

The first magnetic layer structure may include a first ferromagnetic layer, a coupling layer disposed above the first ferromagnetic layer to anti-ferromagnetically couple the first ferromagnetic layer with a second ferromagnetic layer, wherein the second ferromagnetic layer is disposed above the coupling layer.

The material of the first ferromagnetic layer or the second ferromagnetic layer may be selected from a group of materials consisting of iron, cobalt or alloys thereof.

In an embodiment of the invention, the coupling layer is made of a metal. Furthermore, the coupling layer may include or may be made of a metal selected from a group of metals consisting of ruthenium, chromium, gold, rhenium, osmium, silver or copper.

The first magnetic layer structure may include a first magnetic pinning structure having a first blocking temperature.

The first magnetic pinning structure may include or may be made of iridium manganese.

In an embodiment of the invention, the first magnetic layer structure may be an information storage layer structure to store one or more data items.

Furthermore, the non-magnetic spacer layer structure may include or may be made of a material selected from a group of materials consisting of aluminum oxide, magnesium oxide, titanium oxide or tantalum oxide.

In another embodiment of the invention, the second magnetic layer structure may include at least one magnetic layer.

The second magnetic layer structure may include a plurality of magnetic layers being magnetically coupled with each other.

The material of the magnetic layer or the plurality of magnetic layers of the second magnetic layer structure may be selected from a group of materials consisting of iron, cobalt or alloys thereof.

In an embodiment of the invention, the angle is in a range from about 45° to about 135°, e.g., in a range from about 60° to about 130°.

The second magnetic layer structure may include a second magnetic pinning structure having a second blocking temperature.

The second magnetic pinning structure may include or may be made of platinum manganese.

In an embodiment of the invention, the second blocking temperature is higher than the first blocking temperature.

Furthermore, the second magnetic layer structure may be a self-referencing layer in a read operation to read the content stored in the first magnetic layer structure.

In an embodiment of the invention, the cell is a memory cell, e.g., a magnetoresistive memory cell, e.g., a thermal select magnetoresistive memory cell.

In another embodiment of the invention, an integrated circuit having a cell arrangement is provided. The cell arrangement may include a plurality of cells, wherein each cell may include a first magnetic layer structure having a first magnetization along a first axis, a non-magnetic spacer layer structure disposed above the first magnetic layer structure, and a second magnetic layer structure disposed above the non-magnetic spacer layer structure, wherein the second magnetic layer structure has a second magnetization along a second axis that is arranged at an angle with regard to the first axis such that by changing the direction of the second magnetization, the direction of the first magnetization along the first axis can be determined.

The cells may be memory cells, e.g. magnetoresistive memory cells, e.g., thermal select magnetoresistive memory cells.

Furthermore, the cell arrangement may include a plurality of select transistors, one select transistor being provided for each cell and selecting the respective cell.

In an embodiment of the invention, the cell arrangement may further include a plurality of conductor lines providing an external magnetic field to at least one memory cell.

In an embodiment of the invention, the cell arrangement may further include a heater heating at least one memory cell of the plurality of memory cells.

In an embodiment of the invention, the cell arrangement may further include a controller controlling the reading of a selected cell, wherein the reading may include exciting the second magnetic layer structure such that its magnetization direction is changed, determining a change of the electrical resistance of the cell, and determining the direction of the first magnetization along the first axis using the determined change of the electrical resistance of the cell.

In yet another embodiment of the invention, a method for determining the direction of a first magnetization of a cell of an integrated circuit is provided. The method may include exciting a second magnetic layer structure, which has a second magnetization along a second axis that is arranged in an angle with regard to a first axis along which the first magnetization of the cell is oriented, such that the second magnetization is changed, determining a change of the electrical resistance of the cell, and determining the direction of the first magnetization along the first axis using the determined change of the electrical resistance of the cell.

In an embodiment of the invention, exciting the second magnetic layer structure may include applying a magnetic field to the second magnetic layer structure to change the second magnetization.

In an embodiment of the invention, exciting the second magnetic layer structure may include applying a magnetic field pulse to the second magnetic layer structure to change the second magnetization.

The method may further include heating the second magnetic layer structure above a second blocking temperature of its second pinning structure, and applying a magnetic field to the second magnetic layer structure to change the second magnetization at least partially when the second pinning structure is heated above its second blocking temperature.

Furthermore, heating the second magnetic layer structure above its second blocking temperature may include applying a heating current to at least the second magnetic layer structure.

In yet another embodiment of the invention, an integrated circuit having a cell is provided. The cell may include a first magnetic layer means having a first magnetization along a first axis, a non-magnetic spacer layer means disposed above the first magnetic layer structure, and a second magnetic layer means disposed above the non-magnetic spacer layer means, wherein the second magnetic layer means has a second magnetization along a second axis that is arranged in an angle with regard to the first axis such that by changing the direction of the second magnetization, the direction of the first magnetization along the first axis can be determined.

Furthermore, in an embodiment of the invention, a memory module is provided having a plurality of integrated circuits, wherein at least one integrated circuit of the plurality of integrated circuits includes a cell. The cell may include a first magnetic layer structure having a first magnetization along a first axis, a non-magnetic spacer layer structure disposed above the first magnetic layer structure, and a second magnetic layer structure disposed above the non-magnetic spacer layer structure, wherein the second magnetic layer structure has a second magnetization along a second axis that is arranged in an angle with regard to the first axis such that by changing the direction of the second magnetization, the direction of the first magnetization along the first axis can be determined.

The memory module may be a stackable memory module in which at least some of the integrated circuits are stacked one above the other.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
a first magnetic layer structure having a first magnetization along a first axis, wherein the first magnetic layer structure comprises a plurality of magnetic layers being magnetically coupled with each other;
a non-magnetic spacer layer structure disposed above the first magnetic layer structure; and
a second magnetic layer structure disposed above the non-magnetic spacer layer structure, wherein the second magnetic layer structure has a second magnetization along a second axis that is arranged at an angle with regard to the first axis such that by changing the direction of the second magnetization, the direction of the first magnetization along the first axis can be determined.

2. The integrated circuit of claim 1, wherein the first magnetic layer structure comprises a material selected from the group consisting of iron, cobalt and alloys thereof.

3. The integrated circuit of claim 1, wherein the first magnetic layer structure comprises:
a first ferromagnetic layer;
a second ferromagnetic layer; and
a coupling layer disposed between the first and second ferromagnetic layers to anti-ferromagnetically couple the first ferromagnetic layer with the second ferromagnetic layer.

4. The integrated circuit of claim 3, wherein the material of the first ferromagnetic layer or the second ferromagnetic layer comprises a material selected from the group consisting of iron, cobalt and alloys thereof.

5. The integrated circuit of claim 3, wherein the coupling layer comprises a metal.

6. The integrated circuit of claim 1, wherein the first magnetic layer structure comprises a first magnetic pinning structure having a first blocking temperature.

7. The integrated circuit of claim 1, wherein the first magnetic layer structure is an information storage layer structure to store one or more data items.

8. The integrated circuit of claim 1, wherein the second magnetic layer structure comprises at least one magnetic layer.

9. The integrated circuit of claim 8, wherein the second magnetic layer structure comprises a plurality of magnetic layers that are magnetically coupled with each other.

10. The integrated circuit of claim 1, wherein the angle is in a range from about 45° to about 135°.

11. The integrated circuit of claim 1, wherein the second magnetic layer structure comprises a second magnetic pinning structure having a second blocking temperature.

12. The integrated circuit of claim 11, wherein the second blocking temperature is higher than the first blocking temperature.

13. The integrated circuit of claim 1, wherein the first magnetic layer structure, the non-magnetic spacer layer structure and the second magnetic layer structure form a memory cell.

14. The integrated circuit of claim 13, wherein the memory cell is a magnetoresistive memory cell.

15. An integrated circuit comprising:
a plurality of cells, each cell comprising:
a first magnetic layer structure having a first magnetization along a first axis;
a non-magnetic spacer layer structure disposed above the first magnetic layer structure; and
a second magnetic layer structure disposed above the non-magnetic spacer layer structure, wherein the second magnetic layer structure has a second magnetization along a second axis that is arranged at an angle with regard to the first axis such that by changing the direction of the second magnetization, the direction of the first magnetization along the first axis can be determined; and
a heater heating at least one memory cell of a plurality of memory cells.

16. The integrated circuit of claim 15, further comprising a controller controlling a reading of a selected cell, the reading comprising:
exciting the second magnetic layer structure such that its magnetization direction is changed;
determining a change of electrical resistance of the cell;
determining a direction of the first magnetization along the first axis using the determined change of the electrical resistance of the cell.

17. A method for determining a direction of a first magnetization of a cell, the method comprising:
heating a second magnetic layer structure above a second blocking temperature of a second pinning structure;
exciting the second magnetic layer structure, which has a second magnetization along a second axis that is arranged at an angle with regard to a first axis along which the first magnetization of the cell is oriented, wherein exciting the second magnetic layer structure comprises applying a magnetic field to the second magnetic layer structure to change the second magnetization at least partially when the second pinning structure is heated above its second blocking temperature;
determining a change of electrical resistance of the cell; and
determining a direction of the first magnetization along the first axis using the determined change of the electrical resistance of the cell.

18. The method of claim 17, wherein exciting the second magnetic layer structure comprises applying a magnetic field pulse to the second magnetic layer structure to change the second magnetization.

19. A memory module, comprising:
a plurality of integrated circuits, wherein at least one integrated circuit of the plurality of integrated circuits comprises
a cell, the cell comprising:
a first magnetic layer structure having a first magnetization along a first axis;

a non-magnetic spacer layer structure disposed above the first magnetic layer structure;

a second magnetic layer structure disposed above the non-magnetic spacer layer structure, wherein the second magnetic layer structure has a second magnetization along a second axis that is arranged at an angle with regard to the first axis such that by changing the direction of the second magnetization, the direction of the first magnetization along the first axis can be determined; and a heater heating the cell.

* * * * *